(12) United States Patent  
Kikuchi

(10) Patent No.: US 9,257,460 B2
(45) Date of Patent: Feb. 9, 2016

(54) IMAGE CAPTURING APPARATUS AND CONTROL METHOD THEREFOR

(71) Applicant: CANON KABUSHIKI KAISHA, Tokyo (JP)

(72) Inventor: Shin Kikuchi, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 228 days.

(21) Appl. No.: 13/957,737

(22) Filed: Aug. 2, 2013

(65) Prior Publication Data

US 2014/0054445 A1 Feb. 27, 2014

(30) Foreign Application Priority Data

Aug. 22, 2012 (JP) .................................. 2012-183583

(51) Int. Cl.
*H01L 27/00* (2006.01)
*H01L 27/146* (2006.01)
*H04N 5/355* (2011.01)
*H04N 5/3745* (2011.01)

(52) U.S. Cl.
CPC ............ *H01L 27/146* (2013.01); *H04N 5/3559* (2013.01); *H04N 5/37452* (2013.01)

(58) Field of Classification Search
CPC .................. H01L 27/14603; H01L 27/14643; H04N 5/232; H04N 5/335; H04N 5/355
USPC ........... 250/208.1, 214 R; 348/294, 297, 302, 348/308
See application file for complete search history.

(56) References Cited

U.S. PATENT DOCUMENTS

| 6,051,447 | A | 4/2000 | Lee et al. ......................... 438/48 |
| 7,907,196 | B2 | 3/2011 | Ogura et al. |
| 2002/0000508 | A1 | 1/2002 | Muramatsu et al. ........ 250/208.1 |
| 2015/0129944 | A1* | 5/2015 | Kurokawa et al. ............ 257/292 |
| 2015/0156387 | A1* | 6/2015 | Miyakoshi ............ H04N 5/2353 |

FOREIGN PATENT DOCUMENTS

| JP | 10-209422 A | 8/1998 |
| JP | 2002-77737 A | 3/2002 |

* cited by examiner

*Primary Examiner* — Kevin Pyo
(74) *Attorney, Agent, or Firm* — Fitzpatrick, Cella, Harper & Scinto

(57) ABSTRACT

An image capturing apparatus having pixels is provided. Each pixel includes a photoelectric conversion unit including a charge accumulation region, an output unit configured to output a signal based on a potential of a node electrically connected to the charge accumulation region, and a connection unit configured to electrically connect a capacitance to the node. The charge accumulation region includes a first portion and a second portion. Charge is configured to be first accumulated in the first portion, and, after the first portion is saturated, be accumulated in the second portion. The output unit is configured to output a first signal based on the potential of the node before the capacitance is connected thereto, and, then a second signal based on the potential of the node after the capacitance is connected thereto.

7 Claims, 12 Drawing Sheets

F I G. 3
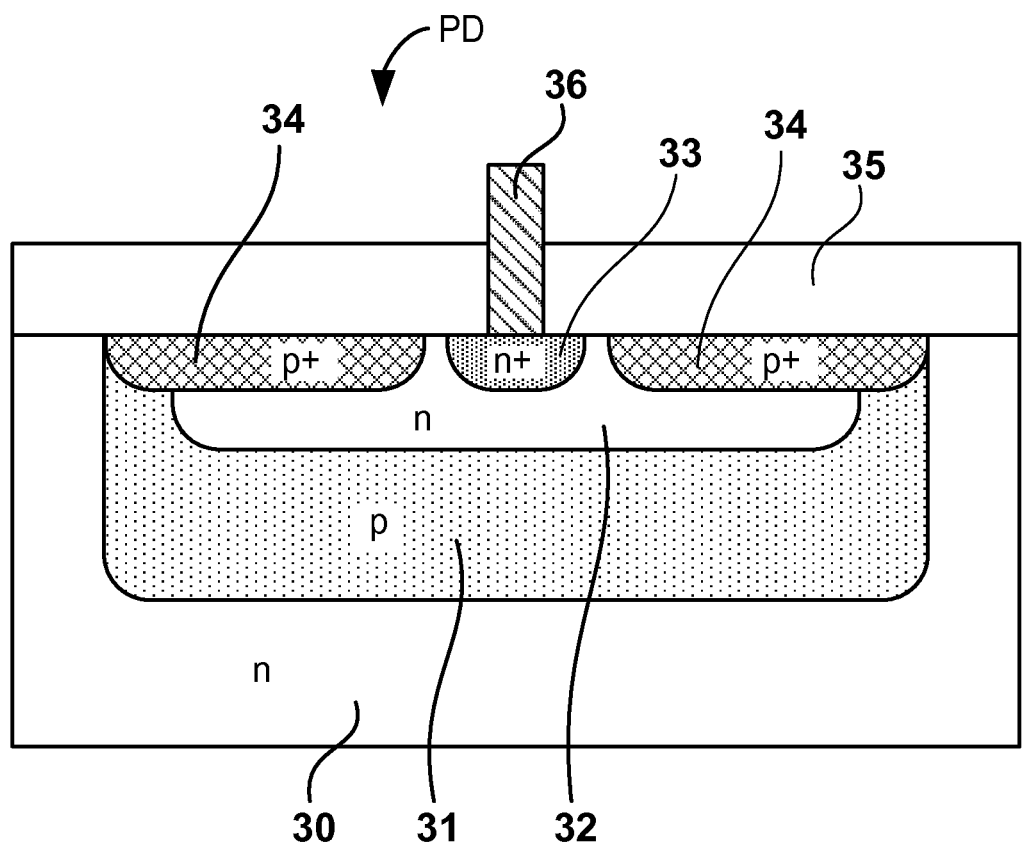

RESET STATE

BEFORE SATURATION

AFTER SATURATION

IMAGE CAPTURING APPARATUS AND CONTROL METHOD THEREFOR

BACKGROUND OF THE INVENTION

1. Field of the Invention

The present invention relates to an image capturing apparatus and a control method therefor.

2. Description of the Related Art

Image capturing apparatuses have been improved in sensitivity and expanded dynamic range, which are two conflicting demands. In order to realize these demands, Japanese Patent Laid-Open No. 10-209422 proposes a photodiode having a pinned region and a region that is not pinned (hereinafter, referred to as an "un-pinned region"). The pinned region refers to a semiconductor region whose surface is provided with a p-type semiconductor region, and has a capacitance value larger than that of the un-pinned region. Charge generated by the photodiode is first accumulated in the un-pinned region. Since the un-pinned region has a small capacitance value, incident light is measured with high sensitivity. When incident light has high illuminance, and the un-pinned region is saturated, charge is then accumulated in the pinned region. Since the pinned region has a large capacitance value, a large amount of charge can be accumulated, and incident light is measured with wide dynamic range. As shown in FIG. 16 of this document, the illuminance/voltage conversion characteristics are switched before and after the saturation of the un-pinned region. Referring to such conversion characteristics, a signal obtained from a pixel is used to determine a pixel value. Japanese Patent Laid-Open No. 2002-77737 proposes a configuration that accumulates charge in a state in which a capacitance is added to a photodiode, in order to expand the dynamic range.

SUMMARY OF THE INVENTION

According to a first aspect, an image capturing apparatus having a plurality of pixels is provided. Each of the plurality of pixels comprises a photoelectric conversion unit including a charge accumulation region, an output unit configured to output a signal based on a potential of a node electrically connected to the charge accumulation region, and a connection unit configured to electrically connect a capacitance to the node. The charge accumulation region includes a first portion and a second portion. Charge generated through photoelectric conversion is configured to be first accumulated in the first portion, and, after the first portion is saturated, be accumulated in the second portion. An amount of change in the potential of the node due to accumulation of a certain amount of charge in the first portion is larger than an amount of change in the potential of the node due to accumulation of the certain amount of charge in the second portion. The output unit is configured to output, after accumulation of charge in the charge accumulation region is started in a state in which the capacitance is not connected to the node, a first signal based on the potential of the node before the capacitance is connected thereto, and, then output a second signal based on the potential of the node after the capacitance is connected thereto.

According to a second aspect, an image capturing apparatus having a plurality of pixels is provided. Each of the plurality of pixels comprises a photoelectric conversion unit including a charge accumulation region, an output unit configured to output a signal based on a potential of a node electrically connected to the charge accumulation region, a connection unit configured to electrically connect a capacitance to the node, and a first holding unit and a second holding unit. The first holding unit is configured to hold a first signal output based on the potential of the node before the capacitance is connected thereto. The second holding unit is configured to hold a second signal output based on the potential of the node after the capacitance is connected thereto.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate some embodiments, and together with the description, serve to explain the principles of some embodiments.

FIG. 3 is a diagram illustrating an exemplary cross-sectional configuration of a pixel according to some embodiments.

DESCRIPTION OF THE EMBODIMENTS

Figure 1:
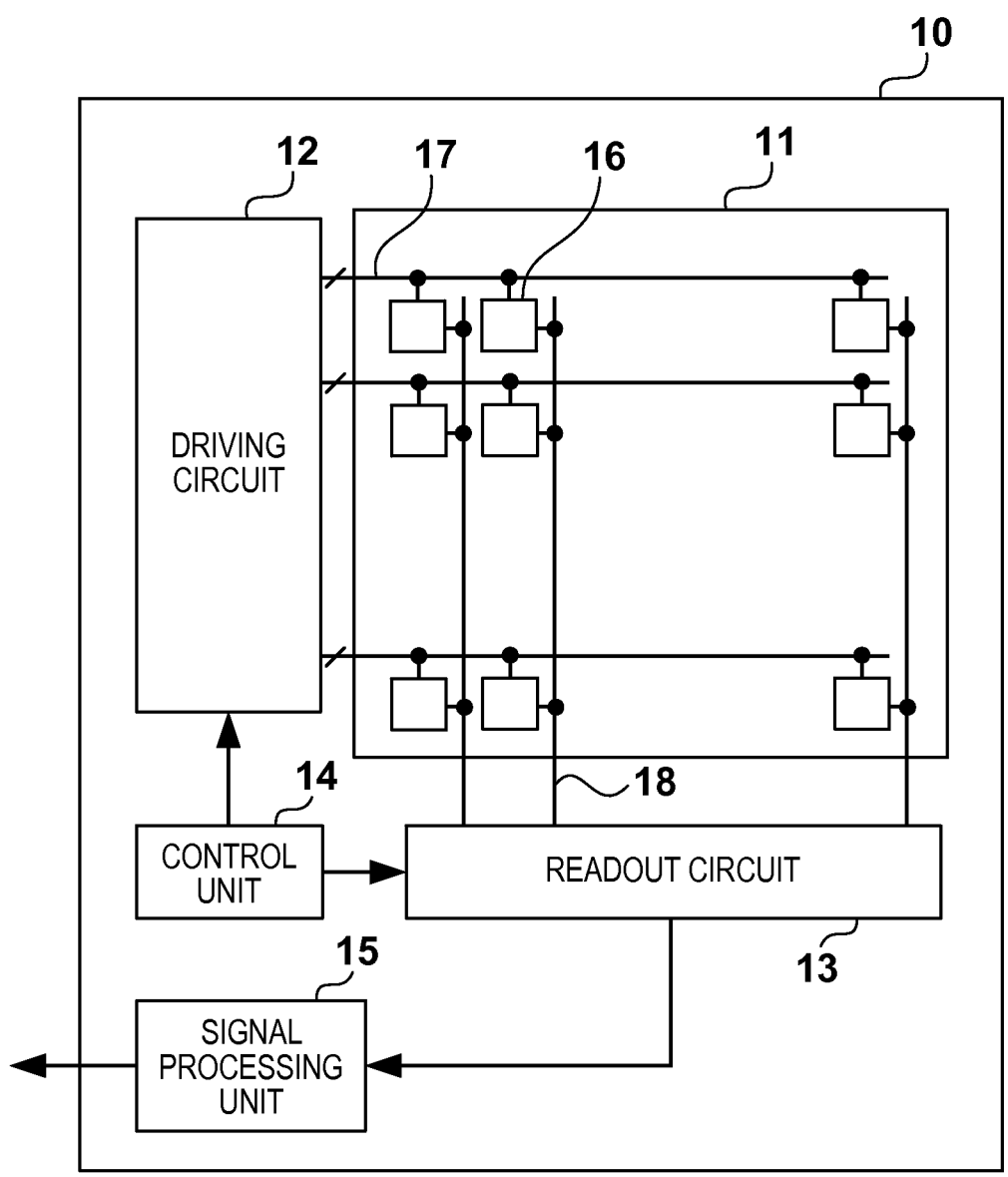
FIG. 1 is a diagram illustrating an exemplary configuration of an image capturing apparatus according to some embodiments.

Various embodiments will now be described with reference to attached drawings. In the various embodiments below, the same constituent elements are denoted by the same reference numerals, and a description thereof will not be repeated. Furthermore, the embodiments can be modified or combined as appropriate.

The photodiode proposed in Japanese Patent Laid-Open No. 10-209422 has a small illuminance/voltage conversion factor when incident light has high illuminance and charge is accumulated in the pinned region. Thus, a pixel signal tends to be affected by non-uniformity of the characteristics from pixel to pixel, and the image quality of an image obtained by the image capturing apparatus deteriorates. In Japanese Patent Laid-Open No. 2002-77737, the capacitance is disconnected before reading out of a signal, and thus, the amount of charge that can be used to read out the signal decreases. Especially in the case of low illuminance where the amount of charge generated is small, the image quality deteriorates.

Accordingly, it is an aspect of some embodiments to provide a technique for improving image quality while achieving improvement of sensitivity and expansion of dynamic range in an image capturing apparatus.

FIG. 1 illustrates an exemplary configuration of an image capturing apparatus 10 according to some embodiment. The image capturing apparatus 10 may include a pixel array 11, a driving circuit 12, a readout circuit 13, a control unit 14, and a signal processing unit 15. In the pixel array 11, pixels 16 that output a signal corresponding to incident light are arranged in an array. In response to an instruction from the control unit 14, the driving circuit 12 supplies a control signal via drive lines 17 to the pixels 16 in the respective rows. In response to an instruction from the control unit 14, the readout circuit 13 reads out a signal output from the pixels 16 to signal lines 18 for the respective columns, and outputs the signal to the signal processing unit 15. Based on the signal output from each of the pixels 16, the signal processing unit 15 determines a pixel value of each of the pixels 16.

Figure 2:
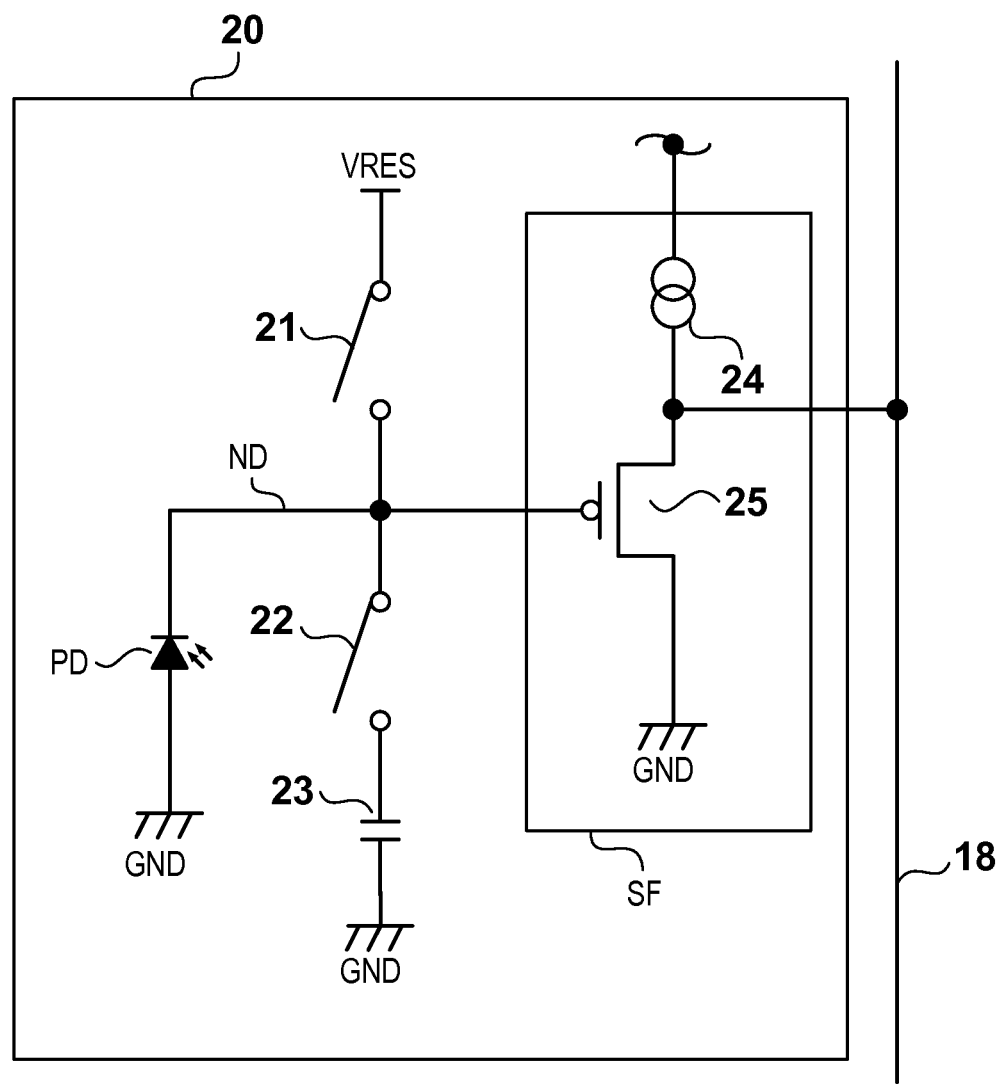
FIG. 2 is a diagram illustrating an exemplary circuit configuration of a pixel according to some embodiments.

FIG. 2 illustrates an exemplary circuit configuration of a pixel 20, which is an example of the pixel 16 in FIG. 1. The pixel 20 may include a depletion type photodiode PD and a switch 21. The photodiode PD functions as a photoelectric conversion unit that generates charge corresponding to incident light. The photodiode PD has an anode that is connected to a ground GND and a cathode that is connected via the switch 21 to a voltage source VRES. When the switch 21 is put in a conducting state (on), the photodiode PD is set to reverse bias with a reset voltage Vres supplied from the voltage source VRES, and at least part of the photodiode PD is depleted. That is to say, the switch 21 functions as a reset unit that resets the photodiode PD. The entire photodiode PD may be depleted by the reset voltage Vres. After the photodiode PD is reset, when the photodiode PD is irradiated with light and charge is generated, the reverse bias is alleviated, and charge is accumulated in the depleted region.

The pixel 20 may further include a switch 22 and a capacitor 23. The capacitor 23 has one of the electrodes (the lower electrode in FIG. 2) that is connected to a ground GND and the other electrode (the upper electrode in FIG. 2) that is connected via the switch 22 to the cathode of the photodiode PD. When the switch 22 is put in a conducting state, the capacitor 23 is connected to the cathode of the photodiode PD, and the capacitance value of the capacitor 23 is added to the capacitance value of the photodiode PD. That is to say, the switch 22 functions as a connection unit that connects the capacitor 23 to the photodiode PD. The switch 21 and the switch 22 are each supplied with control signals from the driving circuit 12 via the drive line 17.

The pixel 20 may further include a source follower circuit SF having a constant current source 24 and a transistor 25. The transistor 25 has a gate that is connected to the cathode of the photodiode PD. The source follower circuit SF is a type of high-impedance input amplifier, and amplifies a signal based on charge accumulated in the photodiode PD and outputs the signal to the signal line 18. Specifically, the source follower circuit SF outputs a signal based on the potential of a node ND connecting the source follower circuit SF and the photodiode PD. In this manner, the source follower circuit SF functions as an output unit that outputs a signal based on the potential of the node ND electrically connected to the photodiode PD. The potential of the node ND can be considered to be equal to both the potential of the input node (the gate of the transistor 25) of the source follower circuit SF and the potential of the cathode of the photodiode PD.

Next, an exemplary cross-sectional structure of the photodiode PD in FIG. 2 will be described with reference to FIG. 3.

FIG. 3 is a diagram focusing on the photodiode PD in the pixel 20 in FIG. 2. FIG. 3 describes the case in which signal charge accumulated in the photodiode PD is electrons, but the conduction types of semiconductor regions may be switched such that electron holes are used as signal charge.

A p-type well region (semiconductor region) 31 is formed in an n-type semiconductor substrate 30, and electrons are generated corresponding to light that is incident on the well region 31. An n-type semiconductor region 32 is formed in the well region 31. An n-type semiconductor region 33 is formed on the center portion of the semiconductor region 32. The semiconductor region 33 has an impurity concentration higher than that of the semiconductor region 32. A p-type semiconductor region 34 is formed on the surface of the semiconductor substrate 30, and the semiconductor region 34 has an impurity concentration higher than that of the well region 31 such that the surface of the semiconductor substrate 30 is not depleted. The surface of the semiconductor substrate 30 is covered by an insulating layer 35 such as an oxide film. The semiconductor region 33 is connected to the source follower circuit SF in FIG. 2 via a contact plug 36 that extends through the insulating layer 35. When the switch 21 is in a non-conducting state (off), the semiconductor region 33 is in an electrically floating state. Accordingly, the semiconductor region 33 may be referred to as a floating diffusion.

The semiconductor region 32 has an impurity concentration of approximately $1 \times 10^{15}$ to $5 \times 10^{17}$ cm$^{-2}$ for example. The semiconductor region 33 has an impurity concentration of approximately $1 \times 10^{18}$ to $5 \times 10^{20}$ cm$^{-2}$ for example. The semiconductor region 34 has an impurity concentration of approximately $1 \times 10^{17}$ to $5 \times 10^{20}$ cm$^{-2}$ for example. With such an impurity concentration distribution, electrons generated by the photodiode PD are collected in the semiconductor region 33, and are first accumulated therein. Then, when the semiconductor region 33 is saturated, electrons are then accumulated in the semiconductor region 32. Furthermore, the semiconductor region 33 having a high impurity concentration has a higher depletion voltage per unit volume than that of the semiconductor region 32. As a result, if the same amount of charge (electrons in this example) is accumulated, the amount of change in the potential of the node ND is larger when the charge is accumulated in the semiconductor region 33 than when accumulated in the semiconductor region 32. In other words, the change in the potential of the node ND due to accumulation of a certain amount of charge in the semiconductor region 33 is more sensitive than the change in the potential of the node ND due to accumulation of charge in the semiconductor region 33. For example, if the same amount of light is irradiated for the same period of time, the same amount of charge is accumulated. In this embodiment, the semiconductor region 33 (first portion) and the semiconductor region 32 (second portion) function as charge accumulation regions.

Figure 4A:
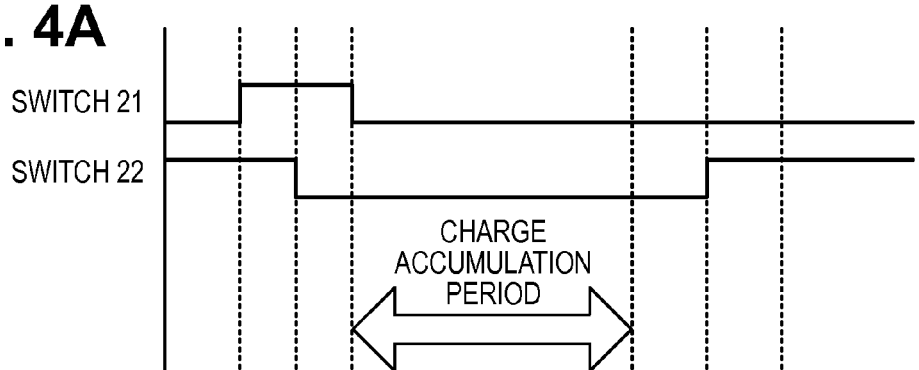
FIGS. 4A to 4C are diagrams illustrating an exemplary method of controlling the image capturing apparatus according to some embodiments.
Figure 4B:
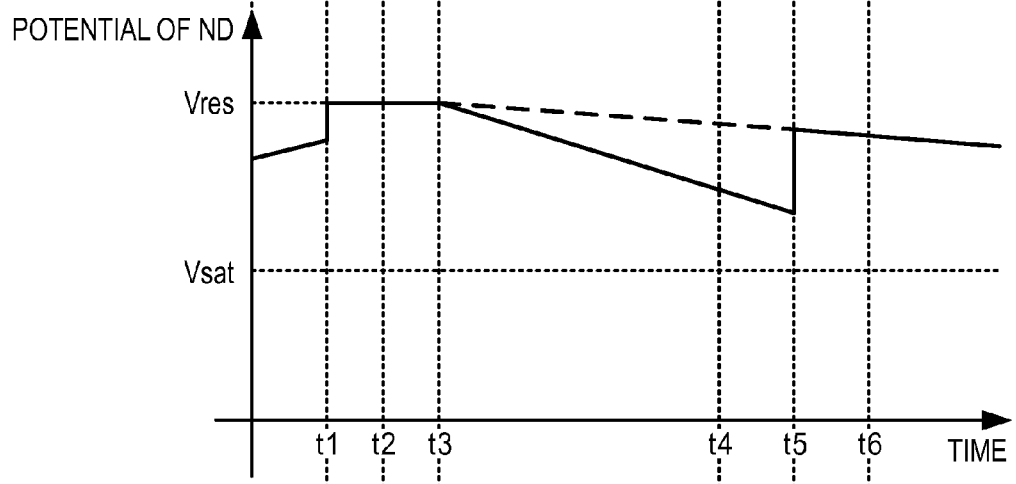
Figure 4C:
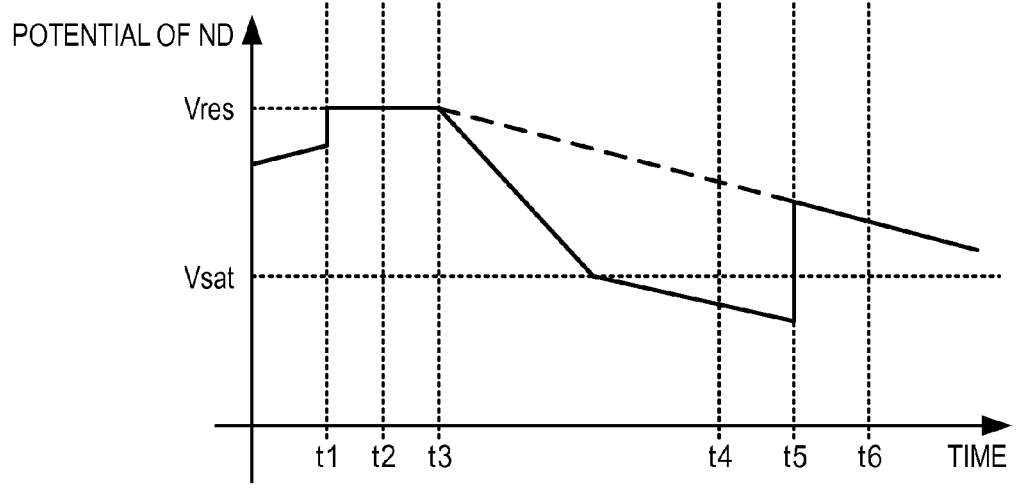

Next, an exemplary method of controlling the image capturing apparatus 10 will be described with reference to FIGS. 4A to 4C. FIG. 4A is a timing chart in this control method, and FIGS. 4B and 4C are graphs indicating the potential of the node ND at each instant of time of the timing chart. FIG. 4B shows the case in which light that is incident on the pixel 20 has low illuminance, and FIG. 4C shows the case in which light that is incident on the pixel 20 has high illuminance. In FIGS. 4B and 4C, the horizontal axis indicates the time, and the vertical axis indicates the potential of the node ND. In the graphs, the upper side on the vertical axis corresponds to "positive". The control method illustrated in this timing chart is performed by supplying a control signal from the driving circuit 12 of the image capturing apparatus 10 to the switches 21 and 22 in the pixel 20. FIGS. 4A to 4C describe the case in which a signal is read out from one pixel 20, but the same control method may be performed on other pixels in the pixel array 11. The same can be applied to control methods in other embodiments described later.

At the time t1, the driving circuit 12 switches, from the low level to the high level, a control signal that is to be supplied to the switch 21, thereby putting the switch 21 in a conducting state. Furthermore, at the time t1, the control signal that is to be supplied from the driving circuit 12 to the switch 22 is at the high level, and the switch 22 is in a conducting state. Accordingly, at the time t1, the potential of the node ND is reset to the reset voltage Vres, and the potential of the capacitor 23 is also reset to the reset voltage Vres. At the time t2, when the driving circuit 12 switches, to the low level, a control signal that is to be supplied to the switch 22, thereby putting the switch 22 in a non-conducting state, the capacitor 23 is disconnected from the photodiode PD.

At the time t3, when the driving circuit 12 switches, to the low level, a control signal that is to be supplied to the switch 21, thereby putting the switch 21 in a non-conducting state, the node ND is in a floating state. Accordingly, the charge generated by the photodiode PD starts to be accumulated in the semiconductor region 33, and the charge accumulation period starts. That is to say, at the time t3 at which the charge accumulation period of the pixel 20 starts, the driving circuit 12 of the image capturing apparatus switches, to the low level, a control signal that is to be supplied to the switch 21. In this embodiment, since charge that is to be accumulated is electrons, the potential of the node ND is lowered as the charge is accumulated.

Figure 5A:
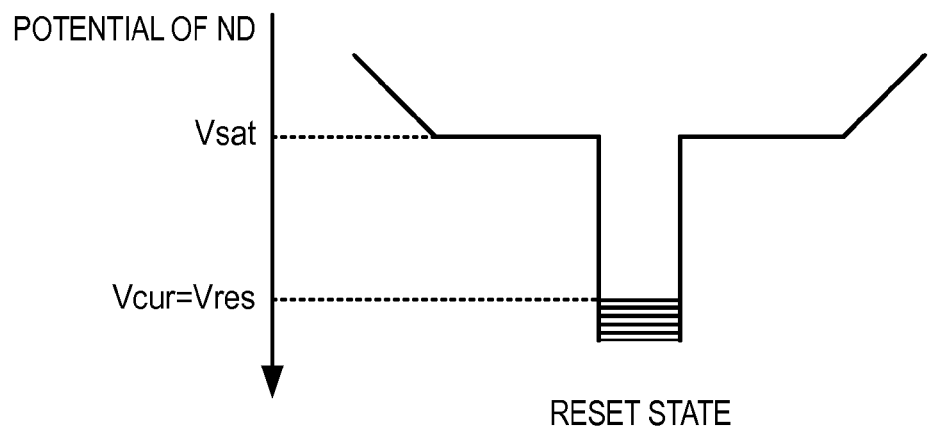
FIGS. 5A to 5C are diagrams illustrating an exemplary change in a potential of a node according to some embodiments.
Figure 5B:
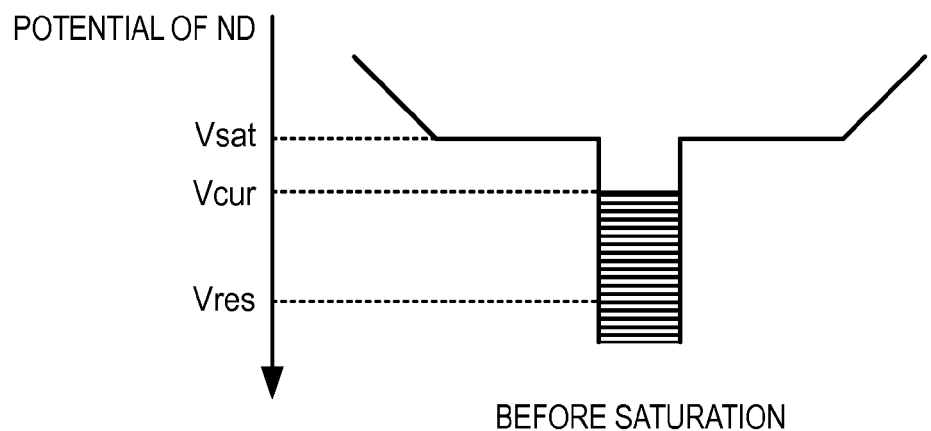
Figure 5C:
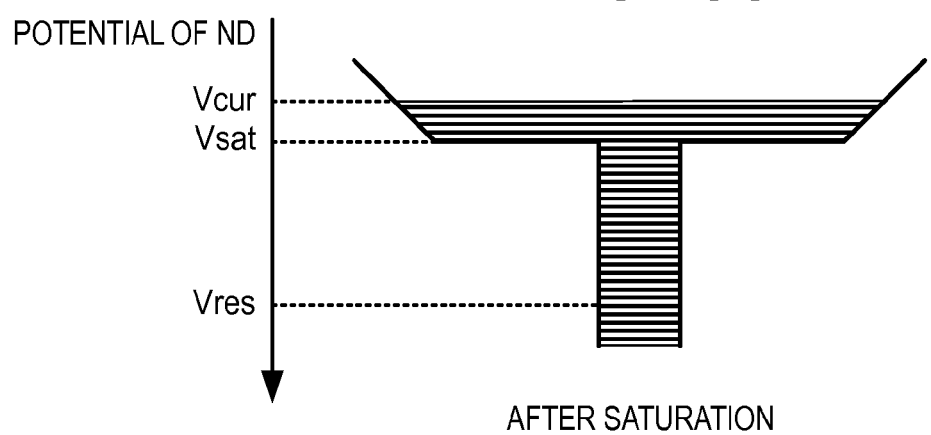

Hereinafter, a change in the potential of the node ND during the charge accumulation period will be described with reference to FIGS. 5A to 5C. FIG. 5A is a schematic diagram showing a state when the charge accumulation period starts at the time t3, FIG. 5B is a schematic diagram showing a state before the semiconductor region 33 is saturated, and FIG. 5C is a schematic diagram showing a state after the semiconductor region 33 is saturated. In the diagrams, the vertical axis indicates the potential of the node ND, and the lower side corresponds to "positive". Furthermore, the area of the hatched portion corresponds to an amount Q of charge accumulated in the photodiode PD. Here, Vcur indicates the potential of the node ND at each instant of time, and Vsat indicates the potential of the node ND when the semiconductor region 33 is saturated. As described above, during the charge accumulation period, the capacitor 23 is disconnected from the node ND. Thus, the potential of the node ND depends on the amount of charge generated by the photodiode PD and the capacitance of the photodiode PD.

FIG. 5A shows a state in which the switch 21 is put in a conducting state, so that the voltage source VRES is connected to the node ND. In this case, the potential of the node ND is equal to the reset voltage Vres supplied by the voltage source VRES. Subsequently, when the switch 21 is put in a non-conducting state, so that the node ND is in a floating state, electrons generated by the photodiode PD are accumulated in the semiconductor region 33, and the potential of the node ND is lowered as shown in FIG. 5B. When the capacitance value of the semiconductor region 33 is taken as Cf, the following relationship holds true before the semiconductor region 33 is saturated, that is, during the period satisfying Vres≥Vcur≥Vsat.

$$Vres - Vcur = Q/Cf$$

In this manner, before the semiconductor region 33 is saturated, the amount of change in the potential of the node ND (i.e., Vres−Vcur) changes in proportion to the amount Q of charge accumulated.

When the amount Q of charge accumulated increases and the semiconductor region 33 is saturated, the charge starts to be accumulated in the semiconductor region 32. Since the capacitance value of the semiconductor region 32 is larger than the capacitance value Cf of the semiconductor region 33, the change in the potential Vcur of the node ND slows down as shown in FIG. 5C. The extent to which the rate of change in the potential Vcur of the node ND decreases depends on the area ratio between the semiconductor region 33 and the semiconductor region 32. The larger the area ratio is, the larger the decrease in the rate of change is, and the larger the amount of charge that can be accumulated in the photodiode PD is. Accordingly, the dynamic range of the photodiode PD can be improved.

Referring to FIGS. 4A to 4C again, when the charge accumulation period ends at the time t4, the readout circuit 13 reads out the signal output by the source follower circuit SF of the pixel 20 to the signal line 18, and outputs the signal to the signal processing unit 15. The operation of the source follower circuit SF outputting a signal is realized by, for example, holding the signal in a memory on the downstream side, or turning on a sample hold switch on the downstream side. The sample hold switch is a switch that connects the source follower circuit SF and a circuit on the downstream side such as a memory or an amplifier. The signal output by the source follower circuit SF is a signal corresponding to the potential of the node ND at the time t4. At the time t5, the driving circuit 12 switches, to the high level, a control signal that is to be supplied to the switch 22, thereby putting the switch 22 in a conducting state. Accordingly, the capacitor 23 is connected to the node ND, and the potential of the node ND changes. At that time, the potential of the node ND may change due to the charge accumulated in the photodiode PD being distributed to the capacitor 23. Subsequently, at the time t6, the readout circuit 13 again reads out the signal output by the source follower circuit SF of the pixel 20 to the signal line 18, and outputs the signal to the signal processing unit 15. The signal output by the source follower circuit SF is a signal corresponding to the potential of the node ND at the time t6. In this example, at the time t6, a signal is read out in a state in which the switch 22 is in a conducting state, that is, in a state in which the capacitor 23 is connected to the photodiode PD. However, at the time t6, a signal may be read out in a state in which the switch 22 is in a non-conducting state. This is because the potential is maintained even when the switch 22 is put in a non-conducting state as long as the switch 22 has been put in a conducting state once, since the charge is distributed when the switch 22 is put in a conducting state.

Next, two signals output by the source follower circuit SF at the times t4 and t6 will be described. The amount of change in the potential of the node ND from Vres (that is, Vres−Vcur) is obtained by dividing the amount of charge accumulated in the pixel 20 by the capacitance value of the node ND. At the time t6, the capacitance value of the capacitor 23 is added to the node ND, and thus, the rate of change (gain) in the potential of the node ND with respect to the amount Q of charge is smaller at the time t6 than at the time t4. Accordingly, in the description below, the signal output by the source follower circuit SF at the time t4 is referred to as a high-gain signal (first signal), and the signal output by the source follower circuit SF at the time t6 is referred to as a low-gain signal (second signal). Furthermore, a state in which the capacitor 23 is not connected to the node ND is referred to as a high-gain state, and a state in which the capacitor 23 is connected to the node ND is referred to as a low-gain state.

When the switch 22 is put in a conducting state, and the state shifts from the high-gain state to the low-gain state, charge accumulated in the semiconductor region 33 (and, in some cases, also in the semiconductor region 32) is distributed to the capacitor 23. Also in this case, recombination of electrons does not occur, and the amount Q of charge generated by and accumulated in the photodiode PD is still maintained. Thus, when the capacitance of the capacitor 23 is taken as Cs, the following relationship holds true.

$$V\text{res} - V\text{cur} = Q/(Cf + Cs)$$

When the capacitance of the capacitor 23 is added to the node ND in this manner, as shown in FIG. 4C, even the amount Q of charge obtained when incident light has high illuminance and not satisfying a linear relationship in a high-gain state can satisfy a linear relationship when being measured in a low-gain state.

Figure 6:
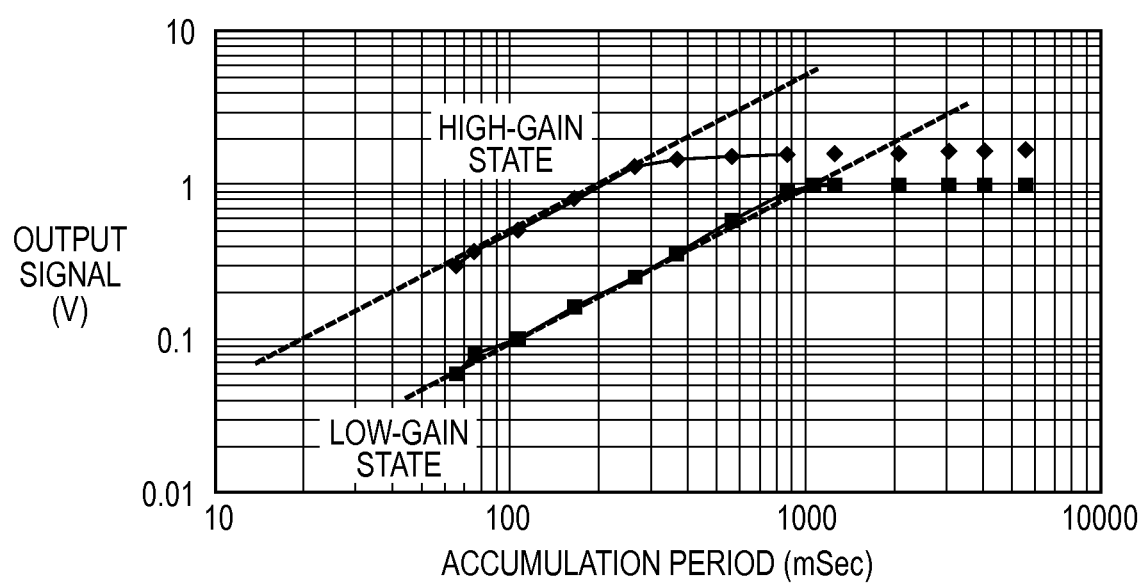
FIG. 6 is a graph illustrating a result of an experiment using the image capturing apparatus according to some embodiments.

FIG. 6 shows a result of an experiment measured with the image capturing apparatus 10 of this embodiment. In the graph in FIG. 6, the horizontal axis indicates the accumulation period. The amount Q of charge accumulated is in proportion to the accumulation period. In the graph in FIG. 6, the vertical axis indicates the value of an output signal output from the source follower circuit SF. In this experiment, assuming that the capacitance value of the semiconductor region 33 is about 5 fF, and that the capacitance value of the capacitor 23 is about 20 fF, the relationship between the accumulation period and the output signal was plotted for each of the low-gain state and the high-gain state. As can be seen from this experimental result, good linearity was obtained in both the low-gain state and the high-gain state. Furthermore, the amount Q of charge at which linearity is not satisfied in the high-gain state due to saturation satisfied linearity in the low-gain state. In the graph shown in FIG. 6, the sensitivity in the high-gain state is about 5 times the sensitivity in the low-gain state. The larger the capacitance ratio between the semiconductor region 33 and the capacitor 23 is, the wider the range in which linearity is satisfied in the high-gain state is. According to experiments by the inventor, linearity was seen up to about 30 times.

In this embodiment, the charge accumulation period (the period from the time t3 to the time t4) is a designed value determined by image capturing conditions. Also, after the charge accumulation period ends (after the time t4), charge is generated by the photodiode PD, and the charge is accumulated in the semiconductor region 33 or the semiconductor region 32. However, if the readout duration is made shorter and the period between the time t4 and the time t6 is made shorter, both a low-gain signal and a high-gain signal for substantially the same amount Q of charge are output to the signal processing unit 15. For example, the readout duration starting from the time t4 and the time t6 can be set to 10 microseconds or shorter for example.

Based on the values of the signals output from the readout circuit 13, the signal processing unit 15 determines which signal to use for determining a pixel value. For example, the signal processing unit 15 may use the low-gain signal to determine the pixel value of the pixel 20 if the signal value shown in FIGS. 4B and 4C is smaller than a predetermined value, and otherwise may use the high-gain signal to determine the pixel value. As this predetermined value, it is possible to use the value of a signal output from the source follower circuit SF when the potential of the node ND is equal to the saturation voltage Vsat. Furthermore, considering the fact that the saturation voltage Vsat may vary from pixel to pixel, offset may be added to the value of a signal output from the source follower circuit SF when the potential of the node ND is equal to the saturation voltage Vsat. Accordingly, even when the saturation voltage Vsat varies from pixel to pixel, the signals from the pixel 20 can be obtained in a linear shape, and the image quality of an image obtained by the image capturing apparatus 10 can be improved.

As a method of forming a charge accumulation region with a plurality of portions having different sensitivities, different impurity concentrations may be set for the semiconductor region 32 and the semiconductor region 33 as described above. Furthermore, a different impurity concentration may be set for the p-type semiconductor region 34 at the p-n junction. As shown in FIG. 3, in the n-type semiconductor region at the p-n junction forming the photodiode PD, the change in the potential of the node ND when charge is accumulated varies between a portion having the p-type semiconductor region 34 on the substrate surface and a portion not having this p-type semiconductor region.

Figure 7A:
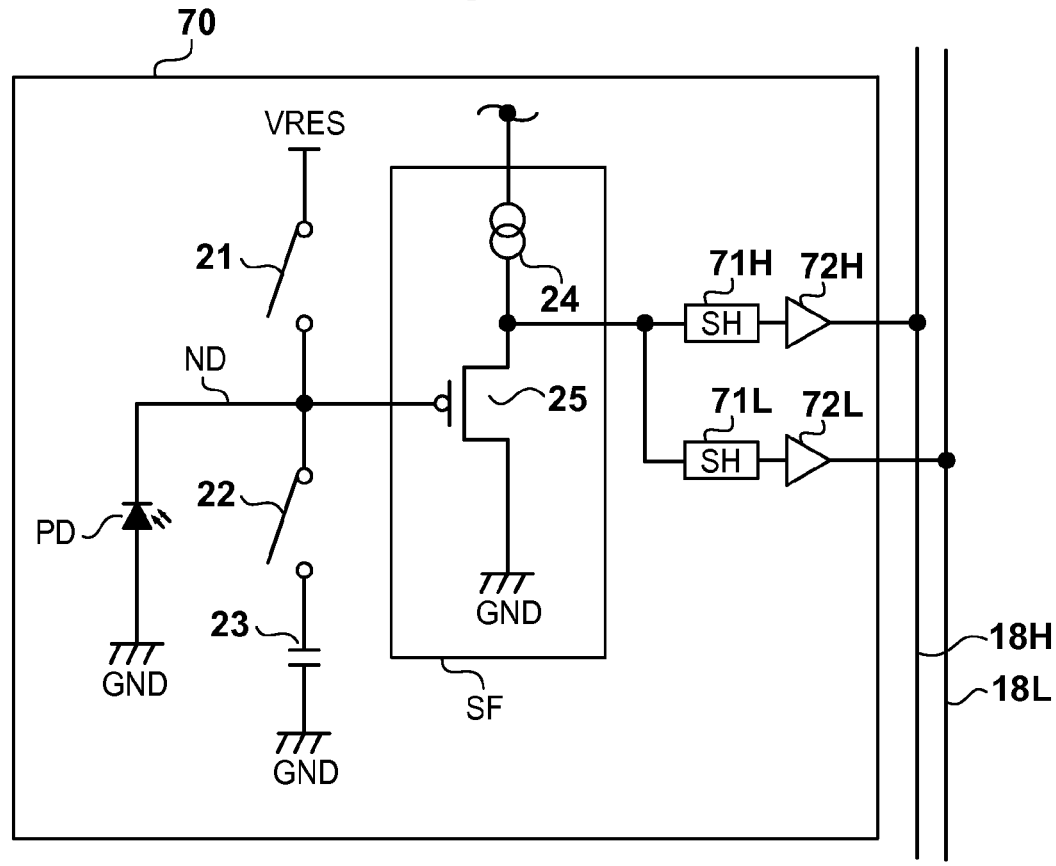
FIGS. 7A and 7B are diagrams illustrating some embodiments.
Figure 7B:
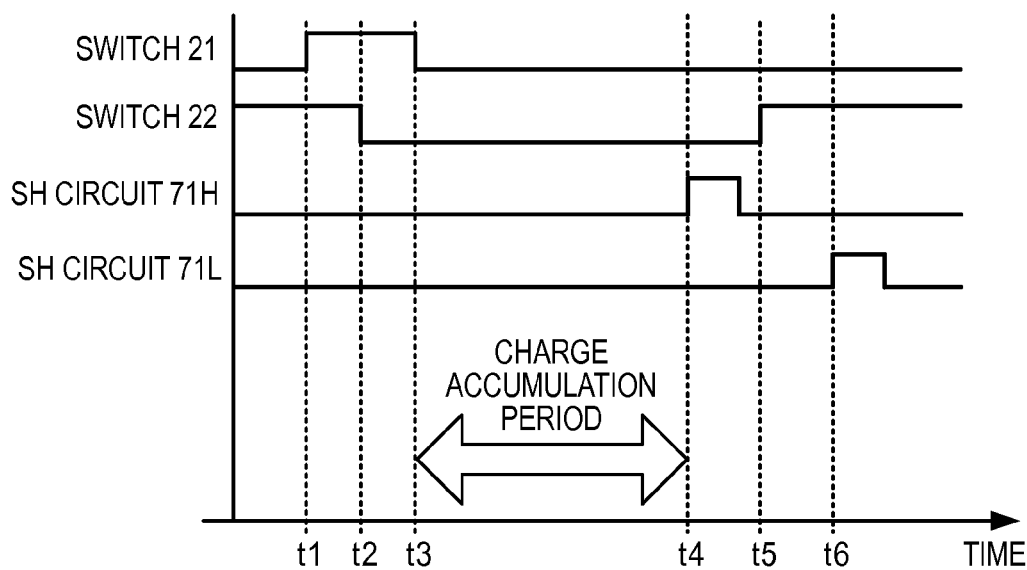

Next, some other embodiments will be described with reference to FIGS. 7A and 7B. FIG. 7A is a circuit diagram illustrating the configuration of a pixel 70 of this embodiment, and FIG. 7B is a timing chart illustrating an exemplary method of controlling the image capturing apparatus 10 including the pixel 70. In this embodiment, as the pixel 16 of the image capturing apparatus 10 in FIG. 1, the pixel 70 shown in FIG. 7A is used. The same constituent elements in the pixel 20 in FIG. 2 and the pixel 70 in FIG. 7A are denoted by the same reference numerals, and a description thereof will not be repeated.

The pixel 70 is different from the pixel 20 in that sample hold circuits (SH circuits) 71H and 71L and output amplifiers 72H and 72L are provided. Furthermore, the signal lines 18 of the image capturing apparatus 10 include signal lines 18H and 18L. The SH circuit 71H (first holding unit) holds a high-gain signal output from the source follower circuit SF, and the SH circuit 71L (second holding unit) holds a low-gain signal output from the source follower circuit SF. Each of the SH circuits 71H and 71L may be configured including a sample hold switch and a signal holding capacitance. The output amplifier 72H outputs the signal held by the SH circuit 71H to the signal line 18H, and the output amplifier 72L outputs the signal held by the SH circuit 71L to the signal line 18L.

Next, an exemplary method of controlling the image capturing apparatus 10 in this embodiment will be described. Graphs indicating the potential of the node ND at each instant of time of the timing chart are the same as those in FIGS. 4B and 4C, and therefore, a description thereof will not be repeated. The control method illustrated in this timing chart is performed by supplying a control signal from the driving circuit 12 of the image capturing apparatus 10 to the switches 21 and 22 and the SH circuits 71H and 71L in the pixel 70.

The operations at the times t1, t2, t3, and t5 are the same as those in the first embodiment, and therefore, a description thereof will not be repeated. When the charge accumulation period ends at the time t4, the driving circuit 12 switches, to the high level, a control signal that is to be supplied to the SH circuit 71H, for a certain period. Accordingly, a high-gain signal output from the source follower circuit SF is held by the SH circuit 71H. At the time t6, the driving circuit 12 switches, to the high level, a control signal that is to be supplied to the SH circuit 71L, for a certain period. Accordingly, a low-gain signal output from the source follower circuit SF is held by the SH circuit 71L. Subsequently, the readout circuit 13 reads out the signal from each of the signal lines 18H and 18L, and outputs the signal to the signal processing unit 15.

This embodiment also achieves the same effects as those in the embodiment described with reference to FIGS. 1 to 6. Furthermore, in the embodiment described with reference to FIGS. 1 to 6, the readout circuit 13 has to read out a high-gain signal and then read out a low-gain signal from all the signal lines 18 corresponding to the respective columns of the pixel array 11. However, in this embodiment, a high-gain signal and a low-gain signal may be held by the SH circuits 71H and 71L in parallel with each other in the pixel 70, after which these signal may be read out by the readout circuit 13. Thus, the period between the time t3 and the time t5 can be made shorter.

Figure 8A:
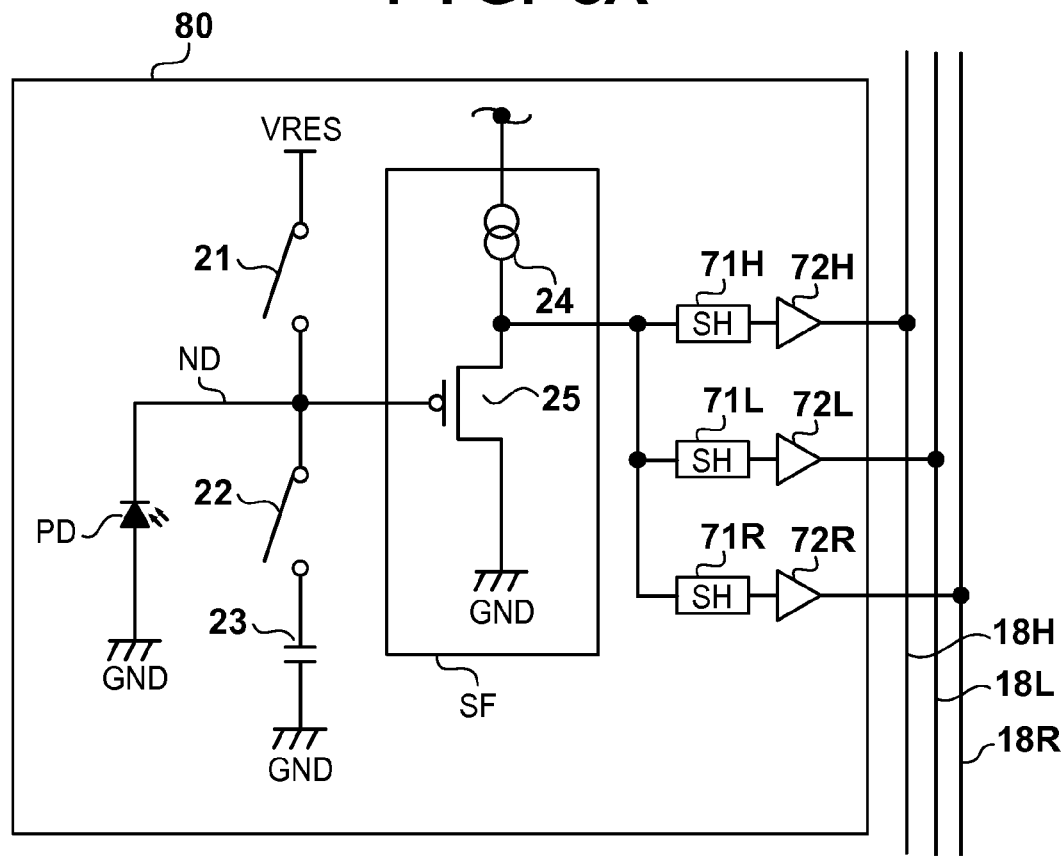
FIGS. 8A and 8B are diagrams illustrating some embodiments.
Figure 8B:
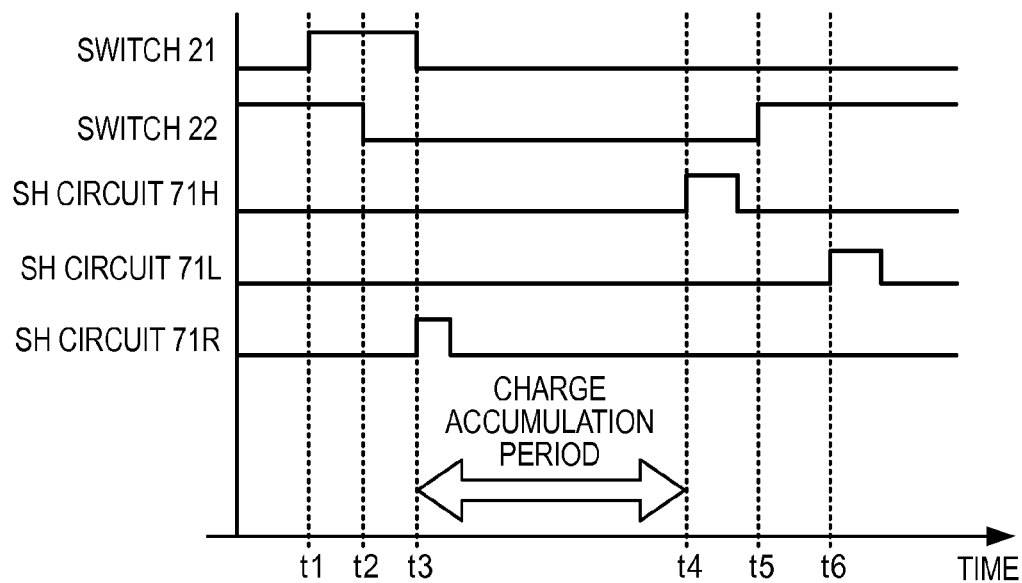

Next, some other embodiments will be described with reference to FIGS. 8A and 8B. FIG. 8A is a circuit diagram illustrating the configuration of a pixel 80 of this embodiment, and FIG. 8B is a timing chart illustrating an exemplary method of controlling the image capturing apparatus 10 including the pixel 80. In this embodiment, as the pixel 16 of the image capturing apparatus 10 in FIG. 1, the pixel 80 shown in FIG. 8A is used. The same constituent elements in the pixel 70 in FIG. 7A and the pixel 80 in FIG. 8A are denoted by the same reference numerals, and a description thereof will not be repeated.

The pixel 80 is different from the pixel 70 in that an SH circuit 71R and an output amplifier 72R are further provided. Furthermore, the signal lines 18 of the image capturing apparatus 10 include signal lines 18H, 18L, and 18R. The SH circuit 71R holds a signal at the time of resetting, which is output from the source follower circuit SF. The output amplifier 72R outputs the signal held by the SH circuit 71R to the signal line 18R.

Next, an exemplary method of controlling the image capturing apparatus 10 in this embodiment will be described. Graphs indicating the potential of the node ND at each instant of time of the timing chart are the same as those in FIGS. 4B and 4C, and therefore, a description thereof will not be repeated. The control method illustrated in this timing chart is performed by supplying a control signal from the driving circuit 12 of the image capturing apparatus 10 to the switches 21 and 22 and the SH circuits 71H, 71L, and 71R in the pixel 80.

The operations at the times t1, t2, and t4 to t6 are the same as those in the second embodiment, and therefore, a description thereof will not be repeated. When the charge accumulation period starts at the time t3, the driving circuit 12 switches, to the low level, a control signal that is to be supplied to the switch 21 as described above, and switches, to the high level, a control signal that is to be supplied to the SH circuit 71R, for a certain period. Accordingly, a signal (hereinafter, referred to as a "reset signal") output from the source follower circuit SF immediately after the charge accumulation period starts is held by the SH circuit 71R. After the time t6, the readout circuit 13 reads out the signal from each of the signal lines 18H, 18L, and 18R, and outputs the signal to the signal processing unit 15. When using the high-gain signal to determine the pixel value, the signal processing unit 15 subtracts the reset signal (third signal) from the high-gain signal, and determines the pixel value based on the obtained value. Accordingly, KTC noise and random noise generated at the time of resetting the photodiode PD can be removed. The smaller the capacitance that is to be reset is, the larger the voltage of random noise is, and thus, it is effective to subtract the reset signal from the high-gain signal. Furthermore, when using the low-gain signal to determine the pixel value, the signal processing unit 15 may subtract the reset signal from the low-gain signal, and may determine the pixel value based on the obtained value. Furthermore, the pixel 80 may further have an SH circuit for holding a signal that is output from the source follower circuit SF in a state in which the capacitor 23 is connected to the node ND during the period between the times t1 and t2. The signal processing unit 15 may subtract this signal from the low-gain signal, instead of the reset signal described above.

Figure 9:
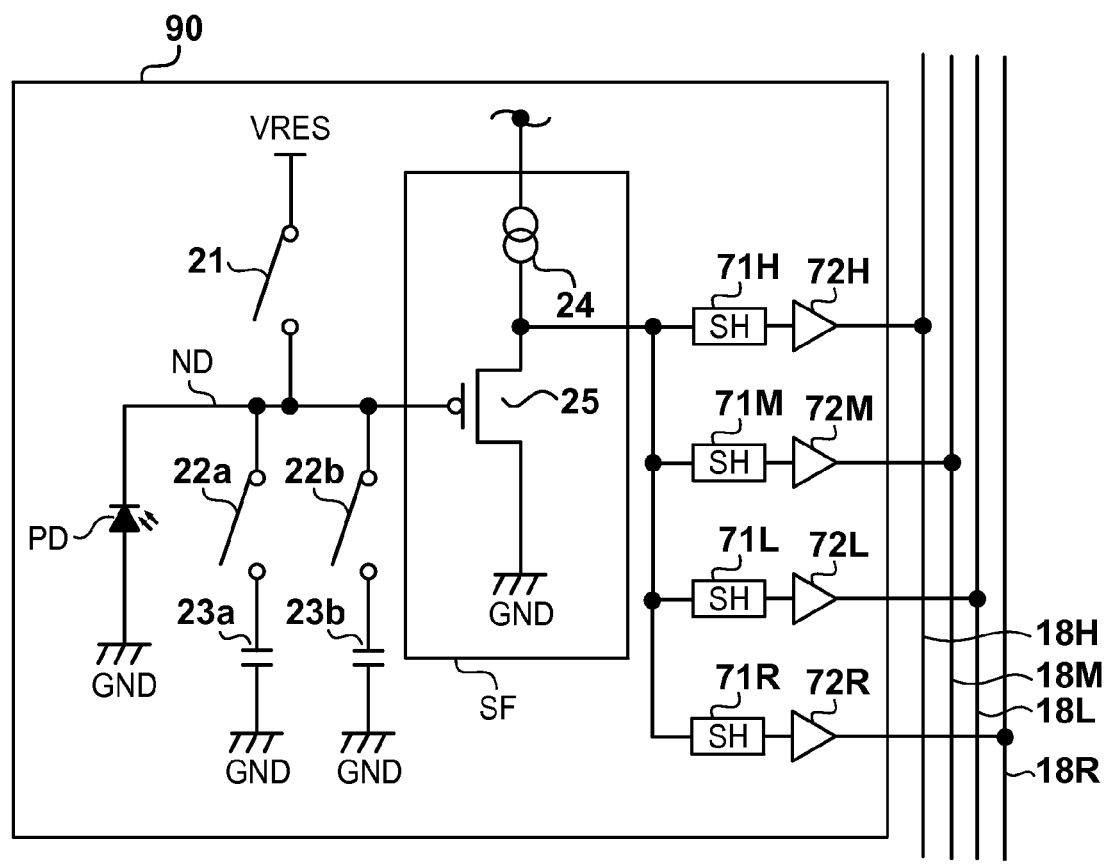
FIG. 9 is a diagram illustrating an exemplary circuit configuration of a pixel according to some embodiments.

Next, some other embodiments of the present invention will be described with reference to FIGS. 9, 10A, and 10B. In the embodiment described with reference to FIGS. 1 to 6, if the amount Q of charge accumulated is large, the potential of the node ND may exceed the saturation voltage Vsat even in the low-gain state, and the linearity of the low-gain signals may not be maintained. In such a case, if the capacitance of the capacitor 23 is increased to maintain the linearity, the amount Q of charge slightly exceeding the saturation voltage Vsat in the high-gain state cannot be measured with sufficient sensitivity. Accordingly, in this embodiment, the capacitance value is added to the node ND in two steps. FIG. 9 is a circuit diagram illustrating the configuration of a pixel 90 of this embodiment. In this embodiment, as the pixel 16 of the image capturing apparatus 10 in FIG. 1, the pixel 90 shown in FIG. 9 is used. The same constituent elements in the pixel 80 in FIG. 8A and the pixel 90 in FIG. 9 are denoted by the same reference numerals, and a description thereof will not be repeated.

The pixel 90 is different from the pixel 80 in that switches 22a and 22b and capacitors 23a and 23b are provided instead of the switch 22 and the capacitor 23 and in that an SH circuit 71M (third holding unit) and an output amplifier 72M are further provided. Furthermore, the signal lines 18 of the image capturing apparatus 10 include signal lines 18H, 18M, 18L, and 18R. The switch 22a and the capacitor 23a have configurations similar to those of the switch 22 and the capacitor 23, and the switch 22b and the capacitor 23b also have configurations similar to those of the switch 22 and the capacitor 23. The SH circuit 71M holds a signal output from the source follower circuit SF. The output amplifier 72M outputs the signal held by the SH circuit 71M to the signal line 18M.

Figure 10A:
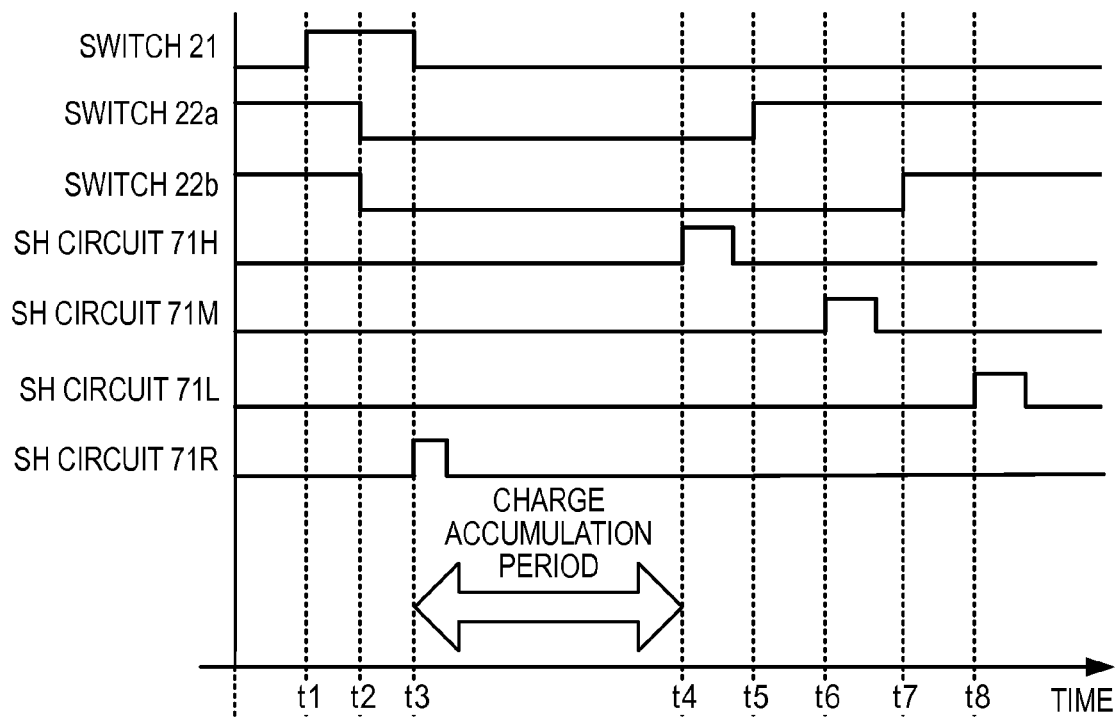
FIGS. 10A and 10B are graphs illustrating an exemplary method of controlling the image capturing apparatus according to some embodiments.
Figure 10B:
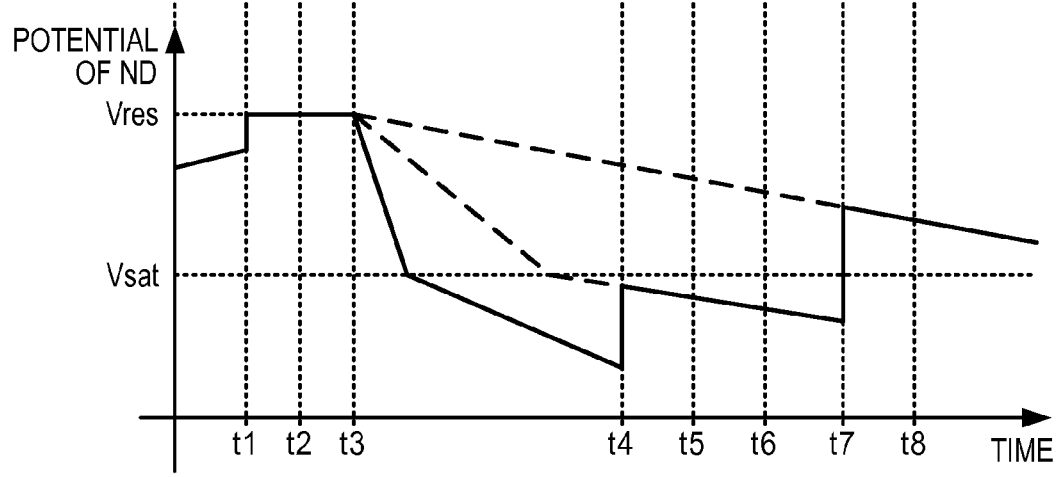

FIG. 10A is a timing chart illustrating an exemplary method of controlling the image capturing apparatus 10 including the pixel 90, and FIG. 10B is a diagram illustrating the potential of the node ND. The operations at the time t1 to t3 are the same as those in the third embodiment, and therefore, a description thereof will not be repeated. Note that at the time t2, instead of the switch 22 being switched to a non-conducting state, the switches 22a and 22b are switched to a non-conducting state. When the charge accumulation period ends at the time t4, the driving circuit 12 switches, to the high level, a control signal that is to be supplied to the SH circuit 71H, for a certain period. Accordingly, a signal (high-gain signal) output from the source follower circuit SF is held by the SH circuit 71H. At the time t5, the driving circuit 12 switches, to the high level, a control signal that is to be supplied to the switch 22a, thereby putting the switch 22a in a conducting state. Accordingly, the capacitor 23a is connected to the node ND, and the potential of the node ND changes. As shown in FIG. 10B, even when the capacitance value of the capacitor 23a is added to the node ND, the potential of the node ND is still lower than the saturation voltage Vsat. At the time t6, the driving circuit 12 switches, to the high level, a control signal that is to be supplied to the SH circuit 71M, for a certain period. Accordingly, a signal (mid-gain signal) output from the source follower circuit SF is held by the SH circuit 71M. At the time t7, the driving circuit 12 switches, to the high level, a control signal that is to be supplied to the switch 22b, thereby putting the switch 22b in a conducting state. Accordingly, the capacitor 23b is connected to the node ND, and the potential of the node ND changes. At the time t8, the driving circuit 12 switches, to the high level, a control signal that is to be supplied to the SH circuit 71L, for a certain period. Accordingly, a signal (low-gain signal) output from the source follower circuit SF is held by the SH circuit 71L.

Subsequently, the readout circuit 13 reads out the signal from each of the signal lines 18H, 18M, 18L, and 18R, and outputs the signal to the signal processing unit 15. The signal processing unit 15 uses any one of the high-gain signal, the mid-gain signal, and the low-gain signal, and the reset signal to determine the pixel value. The signal processing unit 15 uses the low-gain signal to determine the pixel value of the pixel 90, if the potential Vt4 of the node ND at the time t4 satisfies Vt4>Vsat. Otherwise, the signal processing unit 15 may use the mid-gain signal to determine the pixel value, if the potential Vt6 of the node ND at the time t6 satisfies Vt6>Vsat, and, in other cases, may use the high-gain signal to determine the pixel value. Furthermore, considering the fact that the saturation voltage Vsat may vary from pixel to pixel, offset may be added to the saturation voltage Vsat as in the embodiment described with reference to FIGS. 1 to 6. In this embodiment, the capacitance that is to be added to the node ND is switched between two steps, but may be switched between three or more steps.

Figure 11A:
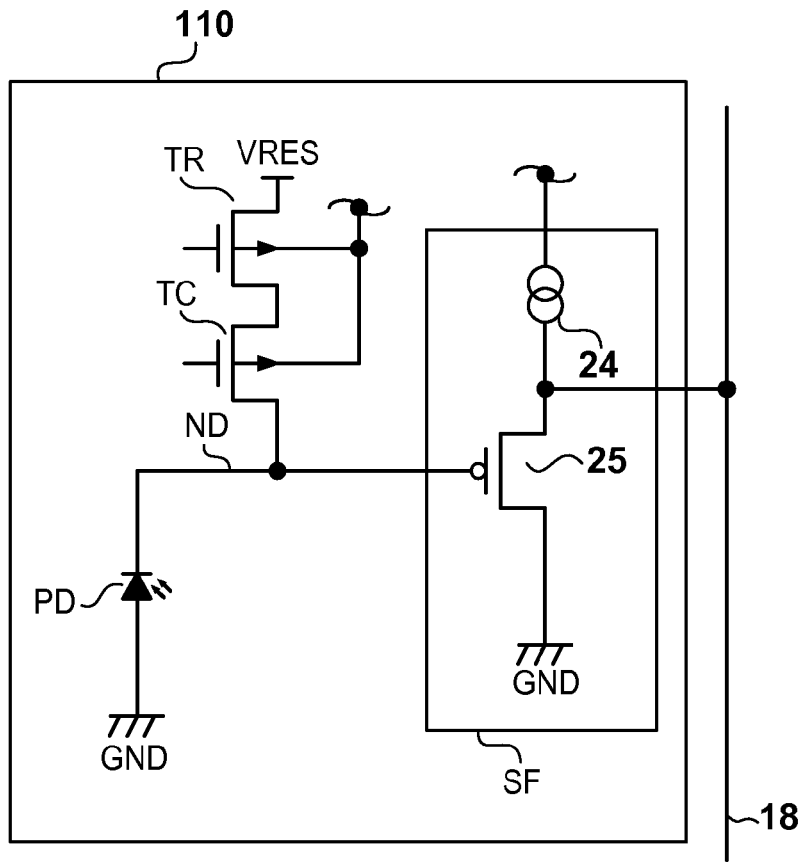
FIGS. 11A and 11B are diagrams illustrating some embodiments.
Figure 11B:
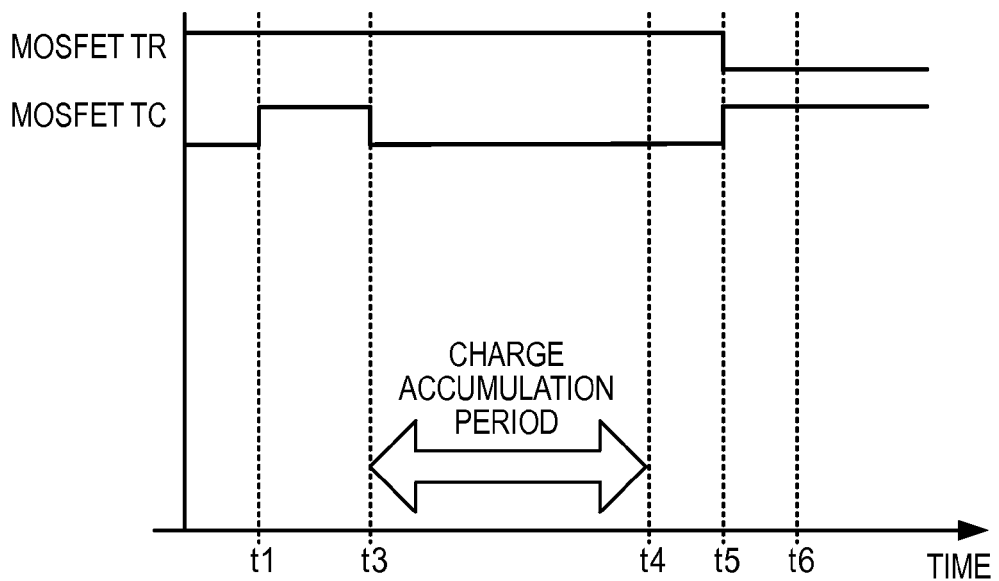

Next, some other embodiments will be described with reference to FIGS. 11A and 11B. FIG. 11A is a circuit diagram illustrating the configuration of a pixel 110 of this embodiment, and FIG. 11B is a timing chart illustrating an exemplary method of controlling the image capturing apparatus 10 including the pixel 110. In this embodiment, as the pixel 16 of the image capturing apparatus 10 in FIG. 1, the pixel 110 shown in FIG. 11A is used. The same constituent elements in the pixel 20 in FIG. 2 and the pixel 110 in FIG. 11A are denoted by the same reference numerals, and a description thereof will not be repeated. The pixel 110 is different from the pixel 20 in that MOS transistors (MOSFETs) TR and TC are provided instead of the switches 21 and 22 and the capacitor 23. The MOS transistors TR and TC are connected in series between the voltage source VRES and the node ND.

Next, an exemplary method of controlling the image capturing apparatus 10 in this embodiment will be described. Graphs indicating the potential of the node ND at each instant of time of the timing chart are the same as those in FIGS. 4B and 4C, and therefore, a description thereof will not be repeated. The control method illustrated in this timing chart is performed by supplying a control signal from the driving circuit 12 of the image capturing apparatus 10 to the gates of the MOS transistors TR and TC in the pixel 110.

At the time t1, the driving circuit 12 switches, from the low level to the high level, a control signal that is to be supplied to the MOS transistor TC, thereby putting the MOS transistor TC in a conducting state. Furthermore, at the time t1, the control signal that is to be supplied from the driving circuit 12 to the MOS transistor TR is at the high level, and the MOS transistor TR is in a conducting state. Accordingly, at the time t1, the potential of the node ND is reset to the reset voltage Vres. In this manner, the MOS transistors TC and TR together function as reset units.

At the time t3, when the driving circuit 12 switches, to the low level, a control signal that is to be supplied to the MOS transistor TC, thereby putting the MOS transistor TC in a non-conducting state, the node ND is in a floating state. Accordingly, the charge generated by the photodiode PD starts to be accumulated in the semiconductor region 33, and the charge accumulation period starts. That is to say, at the time t3 at which the charge accumulation period of the pixel 110 starts, the driving circuit 12 of the image capturing apparatus switches, to the low level, a control signal that is to be supplied to the MOS transistor TC. Also in this embodiment, since charge that is to be accumulated is electrons, the potential of the node ND is lowered as the charge is accumulated.

When the charge accumulation period ends at the time t4, the readout circuit 13 reads out the signal output by the source follower circuit SF of the pixel 110 to the signal line 18, and outputs the signal to the signal processing unit 15. The signal output by the source follower circuit SF is a signal (high-gain signal) corresponding to the potential of the node ND at the time t4. At the time t5, the driving circuit 12 switches, to the low level, a control signal that is to be supplied to the MOS transistor TR, thereby putting the MOS transistor TR in a non-conducting state. Simultaneously, or subsequently, the driving circuit 12 switches, to the high level, a control signal that is to be supplied to the MOS transistor TC, thereby putting the MOS transistor TC in a conducting state. Accordingly, the capacitance value of the MOS transistor TC is added to the node ND, and the potential of the node ND changes. Accordingly, the MOS transistor TC functions as a connection unit that connects a capacitance to the node ND. Subsequently, at the time t6, the readout circuit 13 again reads out the signal output by the source follower circuit SF of the pixel 110 to the signal line 18, and outputs the signal to the signal processing unit 15. The signal output by the source follower circuit SF is a signal (low-gain signal) corresponding to the potential of the node ND at the time t6.

This embodiment also achieves the same effects as those in the embodiment described with reference to FIGS. 1 to 6. Furthermore, in this embodiment, since only the MOS transistor TC is connected as a switch to the node ND, the capacitance of the node ND can be lowered. Also in this embodiment, each pixel may have an SH circuit that holds output from the source follower circuit SF as in the embodiments described above.

Figure 12A:
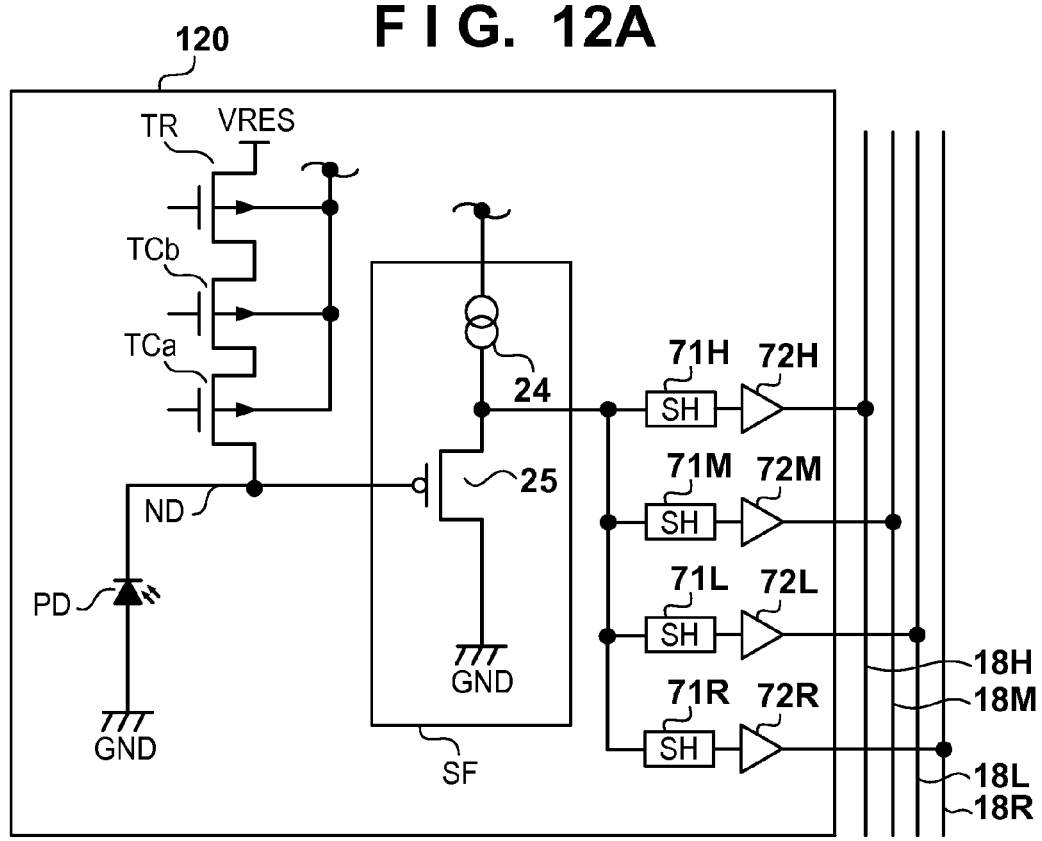
FIGS. 12A and 12B are diagrams illustrating some embodiments.
Figure 12B:
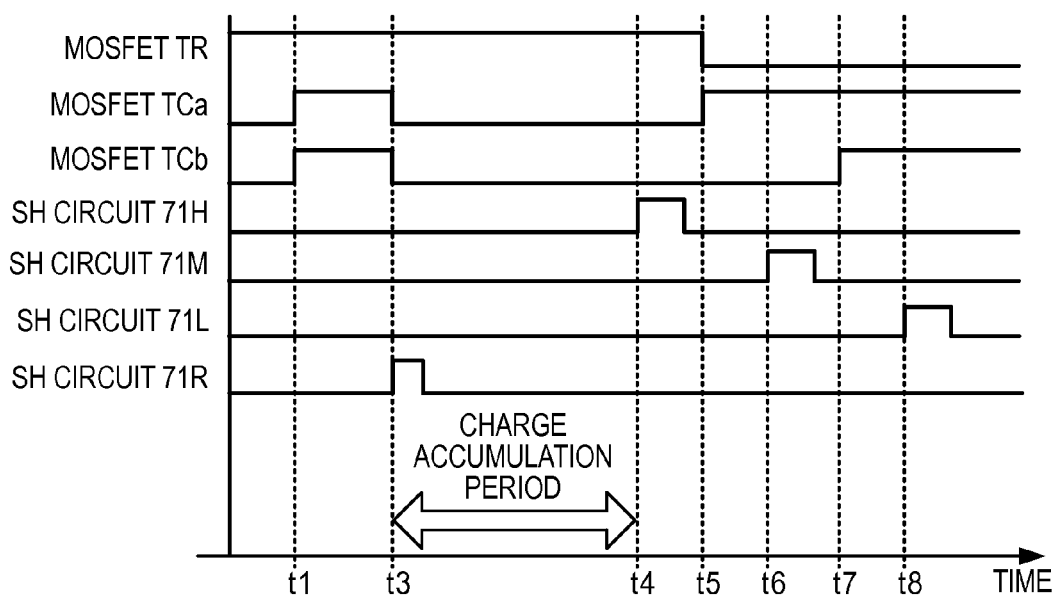

Next, some other embodiments will be described with reference to FIGS. 12A and 12B. FIG. 12A is a circuit diagram illustrating the configuration of a pixel 120 of this embodiment, and FIG. 12B is a timing chart illustrating an exemplary method of controlling the image capturing apparatus 10 including the pixel 120. In this embodiment, as the pixel 16 of the image capturing apparatus 10 in FIG. 1, the pixel 120 shown in FIG. 12A is used. The same constituent elements in the pixel 90 in FIG. 9 and the pixel 120 in FIG. 12A are denoted by the same reference numerals, and a description thereof will not be repeated. Also in this embodiment, the capacitance value is added to the node ND in two steps as in the embodiment described above. The pixel 120 is different from the pixel 90 in that MOS transistors TR, TCa, and TCb are provided instead of the switches 21, 22a, and 22b and the capacitors 23a and 23b. The MOS transistors TR, TCa, and TCb are connected in series between the voltage source VRES and the node ND.

Next, an exemplary method of controlling the image capturing apparatus 10 in this embodiment will be described. A graph indicating the potential of the node ND at each instant of time of the timing chart is the same as that in FIG. 10B, and therefore, a description thereof will not be repeated. The control method illustrated in this timing chart is performed by supplying a control signal from the driving circuit 12 of the image capturing apparatus 10 to the gates of the MOS transistors TR, TCa, and TCb in the pixel 120.

The operations at the times t1 and t3 are the same as those in the embodiment described with reference to FIGS. 11A and 11B, and therefore, a description thereof will not be repeated. Note that at the time t3, the driving circuit 12 switches, to the low level, a control signal that is to be supplied to the MOS transistor TCa and TCb. At the time t5, the driving circuit 12 switches, to the low level, a control signal that is to be supplied to the MOS transistor TR, thereby putting the MOS transistor TR in a non-conducting state. Simultaneously, or subsequently, a control signal that is to be supplied to the MOS transistor TCa is switched to the high level, so that the MOS transistor TCa is put in a conducting state. Accordingly, the capacitance value of the MOS transistor TCa is added to the node ND, and the potential of the node ND changes. At the time t7, the driving circuit 12 switches, to the high level, a control signal that is to be supplied to the MOS transistor TCb, thereby putting the MOS transistor TCb in a conducting state. Accordingly, the capacitance value of the MOS transistor TCb is also added to the node ND, and the potential of the node ND changes. In this manner, the capacitance value is added to the node ND in two steps in this embodiment. Also in this embodiment, four or more MOS transistors may be connected between the voltage source VRES and the node ND, and the capacitance value may be added to the node ND in three or more steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-183583, filed Aug. 22, 2012, which is hereby incorporated by reference herein in its entirety.

What is claimed is:

1. An image capturing apparatus having a plurality of pixels, each of the plurality of pixels comprising:
   a photoelectric conversion unit including a charge accumulation region;
   an output unit configured to output a signal based on a potential of a node electrically connected to the charge accumulation region; and
   a connection unit configured to electrically connect a capacitance to the node, the charge accumulation region including a first portion and a second portion,
   wherein the first and second portions are configured such that charge generated through photoelectric conversion is first accumulated in the first portion and, after the first portion is saturated, is accumulated in the second portion, and that an amount of change in the potential of the node due to accumulation of a certain amount of charge in the first portion is larger than an amount of change in the potential of the node due to accumulation of the certain amount of charge in the second portion, and
   wherein the output unit is configured to output, after accumulation of charge in the charge accumulation region is started in a state in which the capacitance is not connected to the node, a first signal based on the potential of the node before the capacitance is connected thereto, and, then output a second signal based on the potential of the node after the capacitance is connected thereto.

2. The apparatus according to claim 1, further comprising a processing unit configured to determine a pixel value using the signal output from the output unit, based on the first signal in a case in which the first signal value is smaller than a predetermined value, and based on the second signal in a case in which the first signal value is larger than the predetermined value.

3. The apparatus according to claim 2, wherein the predetermined value is based on the potential of the node when the first portion becomes saturated.

4. The apparatus according to claim 1, wherein each of the the plurality of pixels further comprises:
   a first holding unit configured to hold the first signal output from the output unit; and
   a second holding unit configured to hold the second signal output from the output unit.

5. The apparatus according to claim 4, wherein each of the plurality of pixels further comprises:
   a reset unit configured to set the potential of the node to a reset voltage; and
   a third holding unit configured to hold a third signal output by the output unit based on the potential of the node in a state in which the potential of the node is set to the reset voltage.

6. The apparatus according to claim 1, wherein the output unit is configured to output the second signal based on the potential of the node in a state in which the capacitance is connected thereto.

7. A control method for an image capturing apparatus having a plurality of pixels, each of the plurality of pixels comprising a photoelectric conversion unit including a charge accumulation region including a first portion and a second portion, the first and second portions being configured such that charge generated through photoelectric conversion is first accumulated in the first portion and, after the first portion is saturated, is accumulated in the second portion, and that an amount of change in a potential of a node electrically connected to the charge accumulation region due to accumulation of a certain amount of charge in the first portion being larger than an amount of change in the potential of the node due to accumulation of the certain amount of charge in the second portion, the control method comprising:
   starting accumulation of charge in the charge accumulation region;
   outputting a first signal based on the potential of the node after accumulation of charge in the charge accumulation region is started;
   electrically connecting a capacitance to the node after the first signal is output; and
   outputting a second signal based on the potential of the node after the capacitance is connected to the node.

* * * * *